United States Patent
Maki

(10) Patent No.: US 6,545,325 B2
(45) Date of Patent: Apr. 8, 2003

(54) SEMICONDUCTOR DEVICE AND FABRICATION METHOD THEREOF

(75) Inventor: Yukio Maki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/478,986

(22) Filed: Jan. 7, 2000

(65) Prior Publication Data

US 2002/0195667 A1 Dec. 26, 2002

(30) Foreign Application Priority Data

Jul. 15, 1999 (JP) .......................................... 11-201619

(51) Int. Cl.$^7$ .......................... H01L 29/76; H01L 29/94; H01L 31/062; H01L 31/113; H01L 31/119
(52) U.S. Cl. .......................... 257/379; 257/380; 257/381; 257/393
(58) Field of Search ................................. 257/903–904, 257/393, 206, 379–381

(56) References Cited

U.S. PATENT DOCUMENTS 5,879,972 A * 3/1999 Umeki ........................ 438/153

FOREIGN PATENT DOCUMENTS

JP 3-46365 2/1991

OTHER PUBLICATIONS

"16Mbit SRAM Cell Technologies for 2.0V Operation", by H. Ohkubo, et al., IEDM Technical Digest, International Electron Devices Meeting 1991, Washington DC, Dec. 8–11, 1991, pp. 481–484.

* cited by examiner

Primary Examiner—Tom Thomas
Assistant Examiner—Thien F Tran
(74) Attorney, Agent, or Firm—McDermott, Will & Emery

(57) ABSTRACT

Gate electrodes are formed on an element formation region of a silicon substrate. A sidewall insulation film having a width at least half the distance between the gate electrodes is formed on both side faces of respective gate electrodes. The distance L between the gate electrode and another gate electrode is greater than the distance between the gate electrodes. An n$^+$ source region is formed in self-alignment at this region. Accordingly, a semiconductor device is obtained that has the symmetry of the characteristics of access transistors ensured and that has the contact resistance in the storage node contact reduced.

6 Claims, 18 Drawing Sheets

FIG. 30        PRIOR ART
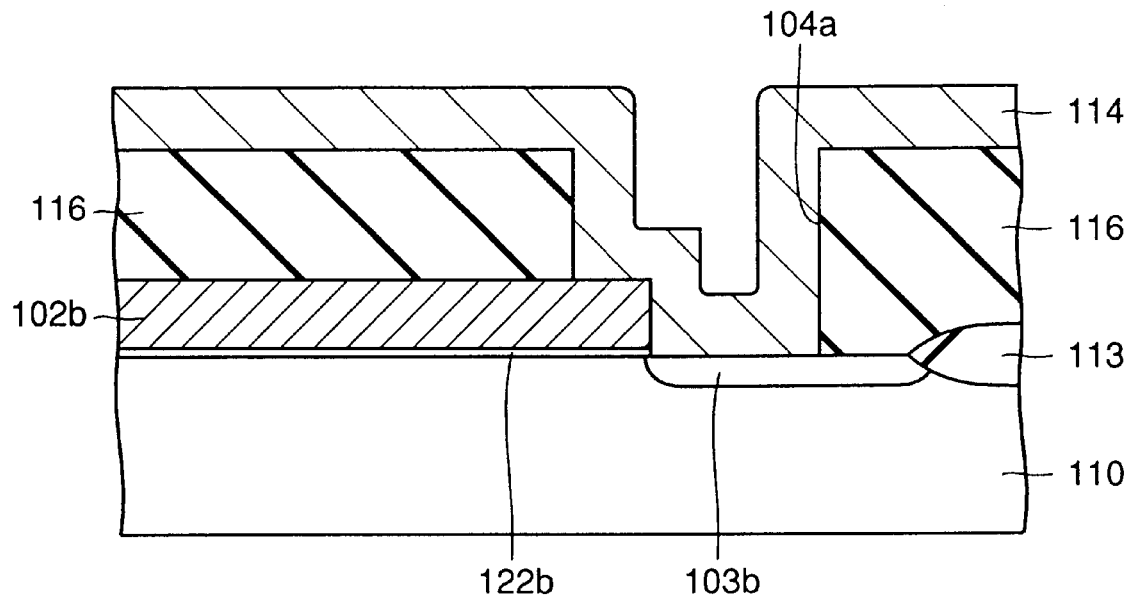
FIG. 31        PRIOR ART
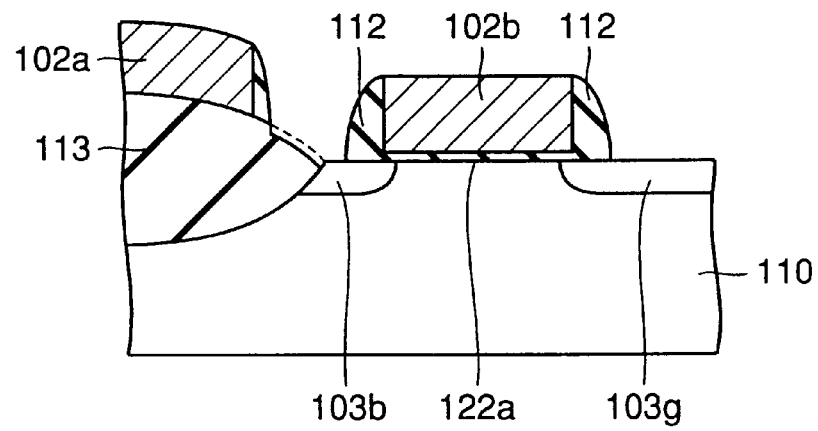

SEMICONDUCTOR DEVICE AND FABRICATION METHOD THEREOF

BACKGROUND OF THE INVENTION

1. Field of the Invention

The present invention relates to a semiconductor device and a fabrication method thereof. Particularly, the present invention relates to a semiconductor device stabilized in the static random access memory cell operation, and a fabrication method of the same.

2. Description of the Background Art

First, the structure of a memory cell in a conventional static random access memory (represented as SRAM hereinafter) will be described. Referring to FIG. 17, one memory cell 107 in an SRAM includes two access transistors A1 and A2, and two driver transistors D1 and D2.

In the region of memory cell 107, element formation regions 101a and 101b divided by a field oxide film are formed at the surface of a silicon substrate. Access transistor A1 and driver transistor D1 are formed at element formation region 101a. Access transistor A2 and driver transistor D2 are formed at element formation region 101b. Pluralities of such memory cells 107 are formed in one SRAM.

An example of fabricating the above memory cell will be described hereinafter according to the cross sectional line XVIII—XVIII of FIG. 17. Referring to FIG. 18, a gate electrode 102a of access transistor A1 is formed on a silicon substrate 110 with a gate insulation film 122a thereunder. Also, a gate electrode 102b of driver transistor D2 is formed via a gate insulation film 122b.

By implanting n type impurities, for example, into silicon substrate 110 with gate electrodes 102a and 102b as a mask, an $n^-$ drain region 103a and an $n^-$ source region 103b of access transistor A1 and an $n^-$ drain region 103g of driver transistor D1 are formed. Referring to FIG. 19, a TEOS film 111 is formed on silicon substrate 110 so as to cover gate electrodes 102a and 102b.

Referring to FIG. 20, TEOS film 111 is subjected to anisotropic etching, whereby a sidewall insulation film 112 is formed at both sides of gate electrode 102a and both sides of gate electrode 102b.

Referring to FIG. 21, n type impurities are implanted into silicon substrate 110 with sidewall insulation film 112 and gate electrodes 102a and 102b as a mask, whereby an $n^+$ drain region 133a and an $n^+$ source region 133b of access transistor A1 and an $n^+$ drain region 133g of driver transistor D1 are formed.

Accordingly, access transistor A1 is formed including gate electrode 102a, $n^-$ and $n^+$ drain regions 103a and 133a, and $n^-$ and $n^+$ source regions 103b and 133b. At the same time, the other driver transistors D1 and D2 and access transistor A2 shown in FIG. 17 are formed. Thus, the main part of the memory cell in SRAM is formed.

As one method of stabilizing the memory cell operation in an SRAM, the method of increasing the ratio of the current drivability of the driver transistor to that of the access transistor (beta ratio) is known. More specifically, the impurity concentration of the source region in the access transistor is lowered to reduce the current drivability of the access transistor for improvement of the beta ratio.

When the above-described fabrication method is employed, an $n^+$ source region 133b of relatively high impurity concentration is formed at the source region of access transistor A1. Therefore, the current drivability of the access transistor cannot be reduced. As a result, the beta ratio cannot be improved.

In view of the foregoing, a structure that does not have an $n^+$ source region in the source region of the access transistor is employed. An example of a fabrication method of a memory cell having such a structure will be described hereinafter.

Referring to FIG. 22 subsequent to the step of FIG. 20, a photoresist pattern 115a is formed to cover $n^-$ source region 103b of access transistor A1 in element formation region 1a sandwiched by gate electrodes 102a and 102b.

At the same time, a photoresist pattern 115b is formed to cover the $n^-$ source region of access transistor A2 in element formation region 101b, as shown in FIG. 23.

Referring to FIG. 24, $n^+$ type impurities are implanted into silicon substrate 110 with photoresist patterns 115a and 115b as a mask. An $n^+$ drain region 133a of access transistor A1 and an $n^+$ drain region 133g of driver transistor D1 are formed. It is noted that an $n^+$ source region is not formed in $n^-$ source region 103b here. Then, photoresist patterns 115a and 115b are removed.

Referring to FIG. 25, a silicon oxide film 116 is formed on silicon substrate 110 to cover gate electrodes 102a and 102b and sidewall insulation film 112. Referring to FIG. 26, a predetermined photoresist pattern (not shown) is formed on silicon oxide film 116.

By etching silicon oxide film 116 anisotropically with that photoresist pattern as a mask, a storage node contact hole 104a is formed, for example, that exposes the surface of gate electrode 102a and the surface of $n^-$ and $n^+$ source regions 103b and 133b.

Referring to FIG. 27, a polysilicon film 114 doped with phosphorous and the like is formed in storage node contact hole 104a. Alternatively, an undoped polysilicon film can be formed, and then impurities such as arsenic can be implanted into that film. Polysilicon film 114 is subjected to a predetermined process, whereby an interconnection and the like are formed. Thus, the main part of a memory cell is completed.

Accordingly, a semiconductor memory device including a memory cell of a relatively high beta ratio of an SRAM is obtained. The sectional views of FIGS. 26 and 27 correspond to the cross sectional line XXVI—XXVI of FIG. 17.

The above fabrication method absent of an $n^+$ source region in the source region of the access transistor induces the following problem.

First, a photomask to form photoresist patterns 115a and 115b had to be newly added.

Second, the property of the access transistor in the memory cell varies such as increase in the contact resistance caused by misalignment of photoresist patterns 115a and 115b. This problem will be described hereinafter.

In the formation of photoresist patterns 115a and 115b, photoresist patterns 115a and 115b may be formed displaced from the predetermined position as shown in, for example, FIGS. 28 and 29, due to misalignment in photolithography.

In the case where photoresist pattern 115a is formed as shown in FIGS. 28 and 29, the region in the proximity of the end portion of gate electrode 102b is covered by photoresist pattern 115a. Impurities of relatively high concentration will not be implanted into this region.

Therefore, the region remaining as the $n^-$ source region differs from access transistor A1 to access transistor A2. The resistance of the source regions may differ therebetween. As a result, the characteristics of the access transistors may become asymmetric in the memory cell.

Furthermore, in the case where only gate electrode 102b and n⁻ source region 103b are exposed at the bottom of storage node contact hole 104a provided at this region, as shown in FIG. 30, the contact resistance of polysilicon film 114 and n⁻ source region 103b will increase.

As to photoresist pattern 115a, the region in the proximity of the end of gate electrode 102d is not covered with photoresist pattern 115b, as shown in FIG. 28. Impurities of relatively high concentration will be implanted into the region of this portion. Therefore, gate electrode 102d and n⁺ source region of access transistor A2 will be exposed at the bottom of storage node contact hole 104b formed at this region. As a result, the contact resistance at this region of storage node contact hole 104b will become relatively small.

Thus, there was a problem that the memory cell cannot operate favorably due to the asymmetry of the characteristics of access transistors A1 and A2 and difference in the contact resistance of respective portions in storage node contact holes 104a and 104b in one memory cell.

The above fabrication method has another disadvantage set forth in the following. Referring to FIG. 31 corresponding to the cross sectional line XXXI—XXXI of FIG. 17, there is a possibility that field oxide film 113 is etched simultaneously at the region indicated by S in the drawing in forming sidewall insulation film 112 on both sides of gate electrodes 102a and 102b.

Thus, there is a problem of leakage current at the area in S of n⁺ source region 133b and n⁺ drain region 133g, as shown in FIG. 32.

SUMMARY OF THE INVENTION

In view of the foregoing, an object of the present invention is to provide a semiconductor device having an impurity region of relatively high concentration formed at a predetermined region of a source region of the access transistor dispensable of an additional photomask, ensured in symmetry of the characteristics of the memory cell and suppressed in leakage current, and a method of fabricating such a semiconductor device.

According to an aspect of the present invention, a semiconductor device of the present invention includes an element formation region, a semiconductor element having a first electrode and one pair of first impurity regions, a second electrode, first and second sidewall insulation films, and a second impurity region of a predetermined conductivity type. The element formation region is divided by an element isolation insulation film at the main surface of a semiconductor substrate. The first electrode is formed to traverse the element formation region. One pair of first impurity regions is formed at element formation region to sandwich the first electrode from both sides, and having a first impurity concentration. The second electrode is formed at the element formation region, extending parallel to and apart from the first electrode by a predetermined distance, having one end located within the element formation region. The first and second sidewall insulation films are formed on the side faces of the first and second electrodes, respectively, at least covering the first impurity region sandwiched by the first and second electrodes, and exposing the first impurity region in the proximity of one end of the second electrode. The second impurity region of the predetermined conductivity type is formed at the exposed first impurity region, and has a second impurity concentration higher than the first impurity concentration. One end of the second electrode is arranged at a position exposing the first impurity region in self-alignment in the proximity of one end in the formation of the first and second sidewall insulation films.

According to the present structure, the second impurity region is formed in self-alignment with the exposed impurity region by arranging one end of the second electrode at a position where the first impurity region can be exposed in self-alignment in the proximity of the one end of the second electrode. In comparison to the case where the second impurity region is formed by photolithography, the conductive layer can be brought into contact with the second electrode and the second impurity region more reliably at the opening portion to reduce the contact resistance in forming an opening in the interlayer insulation film covering the first and second electrodes and then forming the conductive layer in that opening. As a result, the operation of the semiconductor device is stabilized.

Preferably, one end of the second electrode is positioned apart by a distance greater than a predetermined distance from another pattern located at least in the longitudinal direction of the second electrode.

In this case, a portion of the first impurity region can be exposed where the second impurity region is formed in self-alignment at the region between one end of the second electrode and the another pattern.

Preferably, the width of the first sidewall insulation film and the second sidewall insulation film is at least ½ the distance between the first electrode and the second electrode.

In this case, the first impurity region sandwiched between the first and second electrodes can be reliably covered.

Further preferably, the boundary between the element formation region and the element isolation insulation film and also the proximity thereof are covered with the first or second sidewall insulation films except for the portion covered with the first or second electrode.

In this case, in the formation of the first and second sidewall insulation films by, for example anisotropic etching, simultaneous etching of the boundary and the proximity portion thereof can be prevented. As a result, leakage current from the boundary and the proximity portion can be suppressed.

Preferably, a static memory cell is formed at the main surface of the semiconductor substrate, including one pair of driver transistors having their gates and drains cross-coupled, and a pair of access transistors having their sources connected to respective drains of the driver transistors. The semiconductor element includes one of the pair of access transistors.

In this case, the symmetry of the characteristics of the access transistors in the static memory cell is ensured, and variation in the contact resistance is lowered. Therefore, the operation of the SRAM is stabilized.

According to another aspect of the present invention, a semiconductor device includes an element formation region, an electrode layer, and a sidewall insulation film. The element formation region is divided by an element isolation insulation film at the main surface of a semiconductor substrate. The electrode layer is formed on the main surface of the semiconductor substrate. The sidewall insulation film is formed on the side of the electrode layer. The electrode layer and the sidewall insulation film are arranged so that the boundary between the element isolation insulation film and the element formation region and the neighboring region are not exposed in forming the sidewall insulation film by anisotropic etching.

According to the above structure, etching at the boundary and the neighboring region can be prevented. As a result, leakage current from the boundary and the neighboring region can be suppressed.

A fabrication method of a semiconductor device according to a further aspect of the present invention includes the following steps. A semiconductor element including a first electrode traversing an element formation region and one pair of first impurity regions having a first impurity concentration is formed at the element formation region of a semiconductor substrate divided by an element isolation insulation film. A second electrode is formed parallel to and apart from the first electrode by a predetermined distance, and having one end located in the element formation region. At respective sides of the first and second electrodes, first and second sidewall insulation films having a width at least half the predetermined distance are formed, and the surface of the first impurity region in the proximity of at least one end of the second electrode is exposed. A second impurity region having a second impurity concentration higher than the first impurity concentration is formed at the exposed first impurity region. An interlayer insulation film is formed on the semiconductor substrate to cover the semiconductor element. An opening is formed in the interlayer insulation film, exposing the surface of the second electrode and the second impurity region. A conductive layer electrically connected with second electrode and the second impurity region is formed in the opening. The step of forming the second electrode includes the step of arranging one end of the second electrode at a position where the first impurity region is exposed in self-alignment in the proximity of the one end in forming the first and second sidewall insulation films.

By arranging one end of the second electrode at a position where the first impurity region can be exposed in self-alignment in the proximity of the one end of the second electrode in forming the first and second sidewall insulation films, the second impurity region is formed in self-alignment with the exposed first impurity region. As a result, the conductive layer formed in the opening can be brought into contact with the second impurity region more reliably. Thus, the contact resistance can be reduced.

Preferably, the step of forming the first and second sidewall insulation films includes the step of forming a sidewall insulation film having a film thickness at least half the distance between the first and second electrodes on the semiconductor substrate to cover the first and second electrodes, and applying anisotropic etching to the layer that becomes the sidewall insulation film. The step of forming the second electrode includes the step of setting the distance between one end of the second electrode and another pattern located in at least the longitudinal direction of the second electrode greater than the distance between the first and second electrodes.

In this case, the first impurity region located between the first and second electrodes can be covered in self-alignment, and the portion of the first impurity region to form the second impurity region in self-alignment at a region between one end of the second element and the another pattern is exposed.

Also preferably, in the step of applying anisotropic etching to the layer that becomes the sidewall insulation film, the boundary between the element formation region and the element isolation insulation film and also the neighborhood thereof are not exposed.

In this case, simultaneous etching of the boundary and the neighboring region can be prevented when anisotropic etching is applied. As a result, leakage current from the boundary and the neighboring region can be suppressed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 30 is a sectional view of the conventional SRAM taken along line XXX—XXX of FIG. 28 to describe a step carried out subsequent to the steps of FIGS. 28 and 29.

FIG. 31 is a sectional view of a conventional SRAM taken along line XXXI—XXXI of FIG. 17 to describe another problem.

DESCRIPTION OF THE PREFERRED EMBODIMENTS

First Embodiment

Figure 1:
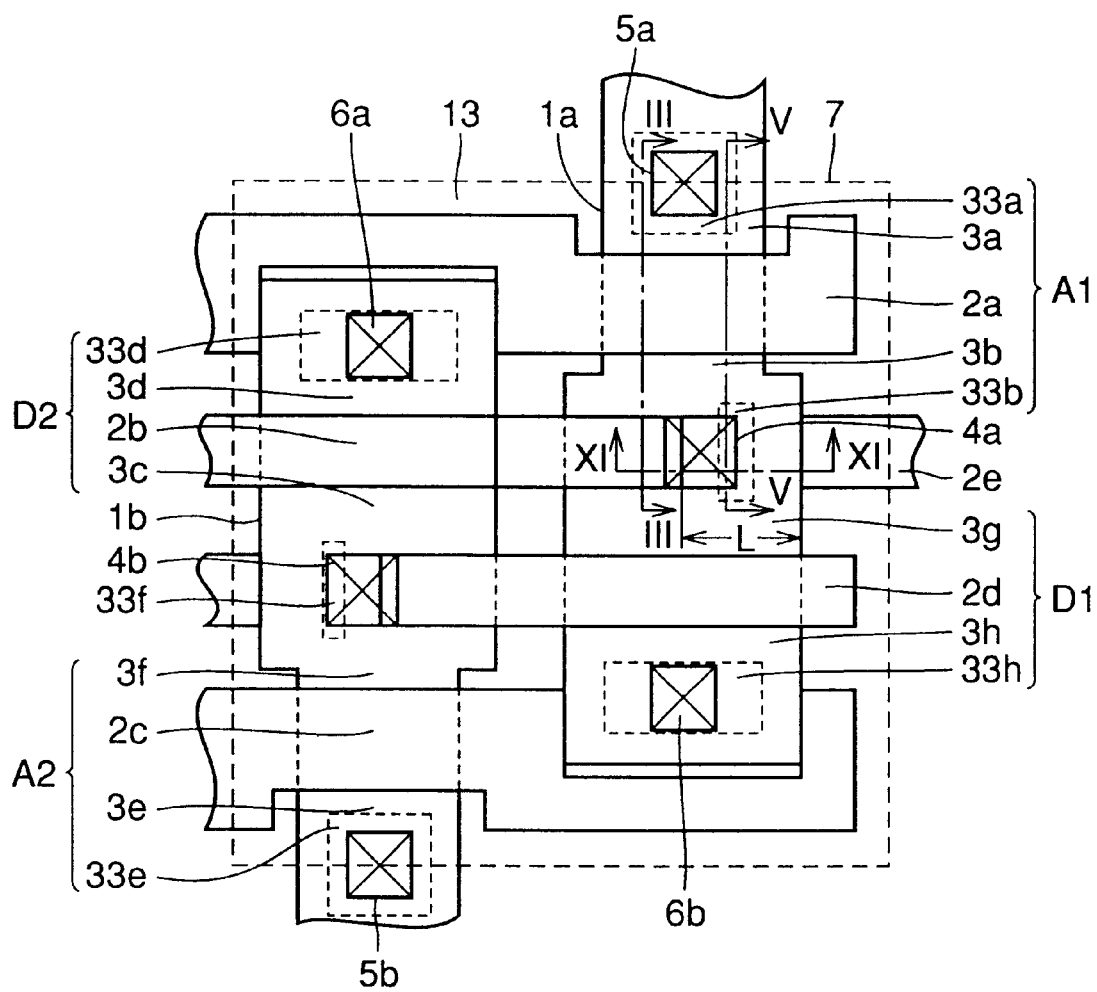
FIG. 1 is a plan view of an SRAM according to a first embodiment of the present invention.
Figure 2:
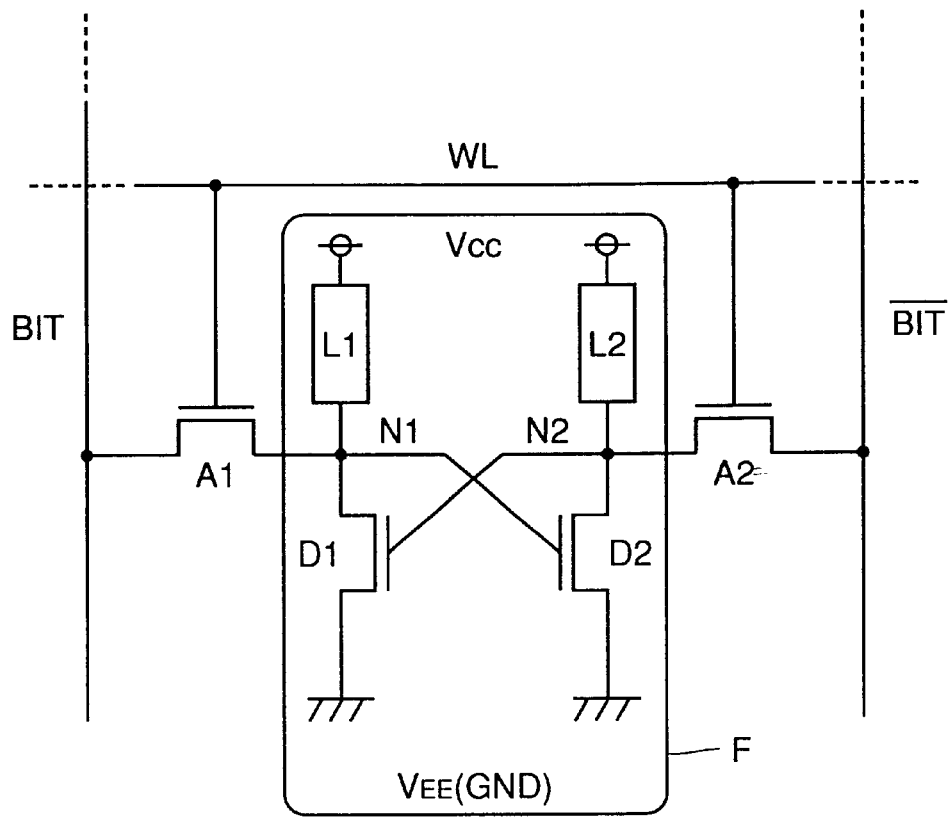
FIG. 2 is a circuit representing an equivalent circuit of a memory cell of an SRAM.

An SRAM according to a first embodiment of the present invention will be described hereinafter. The structure of a memory cell and an equivalent circuit thereof are shown in FIGS. 1 and 2, respectively. Referring to FIGS. 1 and 2, a memory cell is arranged at the crossing of complementary data lines (bit lines) and a word line arranged in a matrix in the SRAM. The memory cell is formed of a flip-flop circuit F and two access transistors A1 and A2.

In flip-flop circuit F, two storage node contacts N1 and N2 are implemented by cross-coupling respective input terminals and output terminals of one inverter formed of, for example, a load element L1 and a driver transistor D1 and another inverter formed of a load element L2 and a driver transistor D2.

Access transistor A1 and driver transistor D1 are formed at an element formation region 1a. Access transistor A2 and driver transistor D2 are formed at an element formation region 1b. Access transistor A1 includes a gate electrode 2a, n⁻ and n⁺ drain regions 3a and 33a, and n⁻ and n⁺ source regions 3b and 33b. Gate electrode 2a thereof is formed to traverse element formation region 1a.

Driver transistor D2 includes a gate electrode 2b, an n⁻ drain region 3c, and n⁻ and n⁺ source regions 3d and 33d. Gate electrode 2b is formed to traverse element formation region 1b, extending parallel to and apart from gate electrode 2a by a predetermined distance, and having one end located within element formation region 1a. N⁺ source region 33b of access transistor A1 is formed between one end of gate electrode 2b and another gate electrode 2e. The distance L between that one end of gate electrode 2b and another gate electrode 2e is greater than the distance between gate electrodes 2a and 2b.

Driver transistor D1 includes a gate electrode 2d, an n⁻ drain region 3g, and n⁻ and n⁺ source regions 3h and 33h. Access transistor A2 includes a gate electrode 2c, n⁻ and n⁺ source regions 3f and 33f, and n⁻ and n⁺ drain regions 3e and 33e.

At storage node contact 4a corresponding to storage node N1, n⁻ and n⁺ source regions 3b and 33b of access transistor A1 are connected to gate electrode 2b of driver transistor D2. At bit line contact 5a, n⁻ and n⁺ drain regions 3a and 33a of access transistor A1 are connected to one of the complementary bit lines.

Similarly, at storage node contact 4b corresponding to storage node N2, n⁻ and n⁺ source regions 3f and 33f of access transistor A2 are connected to gate electrode 2d of driver transistor D1. At a bit line contact 5b, n⁻ and n⁺ drain regions 3e and 33e of access transistor A2 are connected to the other of the complementary bit lines.

At a ground contact 6b, n⁻ and n⁺ source regions 3h and 33h of driver transistor D1 are connected to a ground line $V_{EE}$. At a ground contact 6a, n⁻ and n⁺ source regions 3d and 33d of driver transistor D2 are connected to ground line $V_{EE}$.

Load element L1 has one end connected to n⁻ and n⁺ source regions 3b and 33b of access transistor A1, and the other end connected to a power supply line ($V_{CC}$ line). Load element L2 has one end connected to n⁻ and n⁺ source regions 3f and 33f of access transistor A2, and the other end connected to the power supply line ($V_{CC}$ line):

Gate electrodes 2a and 2c of access transistors A1 and A2 are connected to a word line (WL). Conduction of access transistors A1 and A2 is controlled by this word line.

There are two stable states for storage nodes N1 and N2. More specifically, when the voltage of one storage node is at a high level, the voltage of the other storage node is at a low level, or vice versa. This is called a bistable state. The memory cell can continue to maintain its bistable state as long as a predetermined power supply voltage is applied to the memory cell. In the SRAM, a plurality of the above memory cells 7 are formed at the surface of the silicon substrate.

The operation of this memory cell will be described briefly here. In writing data into a particular memory cell, access transistors A1 and A2 are rendered conductive by a word line (WL) corresponding to that memory cell, and a voltage is forced to the pair of complementary bit lines according to a desired logic value. Accordingly, the potentials of two storage nodes N1 and N2 of flip-flop circuit F are set to the above-described bistable state, whereby the data is retained as a potential difference.

In reading out data, access transistors A1 and A2 are rendered conductive, whereby the potentials of storage nodes N1 and N2 are transmitted to the bit lines. Thus, data is read out. The SRAM of the present embodiment is formed and operated as described above.

Figure 3:
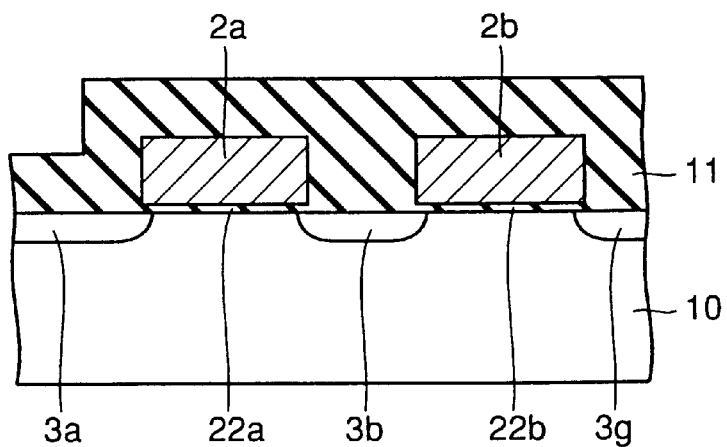
FIG. 3 is a sectional view of the SRAM of the first embodiment taken along line III—III of FIG. 1 to describe a step of a fabrication method thereof.

An example of a fabrication method of the above SRAM will be described on the basis of the sectional line III—III of FIG. 1. Referring to FIG. 3, gate electrodes 2a and 2b are formed on silicon substrate 10 with gate insulation films 22a and 22b thereunder, respectively. By implanting, n type impurities, for example, with gate electrodes 2a and 2b as a mask, n⁻ drain region 3a, n⁻ source region 3b and n⁻ drain region 3g are formed.

A TEOS film 11 is formed to cover gate electrodes 2a and 2b. Here, the film thickness of TEOS film 11 is desirably at least half the distance between gate electrode 2a and gate electrode 2b. Accordingly, n⁻ source region 3b positioned between gate electrodes 2a and 2b is covered with TEOS film 11.

Figure 4:
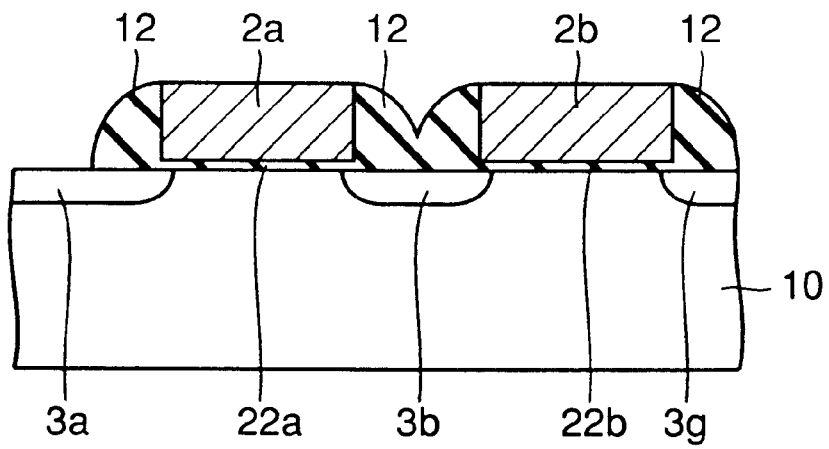
FIG. 4 is a sectional view of the SRAM of the first embodiment showing a step carried out subsequent to the step of FIG. 3.

Referring to FIG. 4, TEOS film 11 is subjected to anisotropic etching, whereby a sidewall insulation film 12 is formed on respective sides of gate electrode 2a and respective sides of gate electrode 2b. Since the initial film thickness of TEOS film 11 is at least half the distance between gate electrodes 2a and 2b, n⁻ source region 3b positioned between gate electrodes 2a and 2b will not be exposed.

Figure 5:
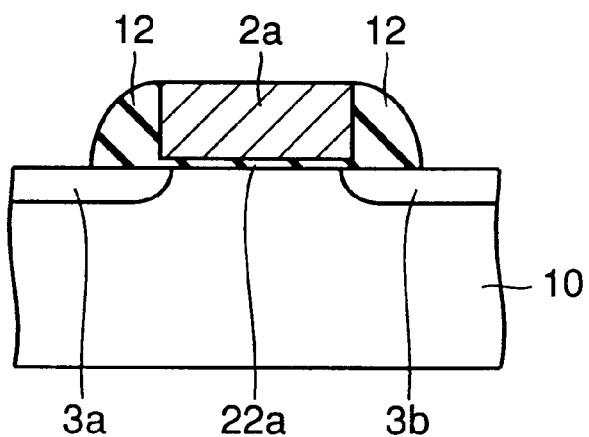
FIG. 5 is a sectional view of the SRAM of the first embodiment taken along line V—V of FIG. 1 in the step shown in FIG. 4.

In the region between one end of gate electrode 2b and another gate electrode 2e, a portion of the surface of n⁻ drain region 3a is exposed. More specifically, according to the cross sectional line V—V of FIG. 1, a portion of the surface of n⁻ source region 3b is exposed by forming sidewall insulation film 12, as shown in FIG. 5.

Figure 6:
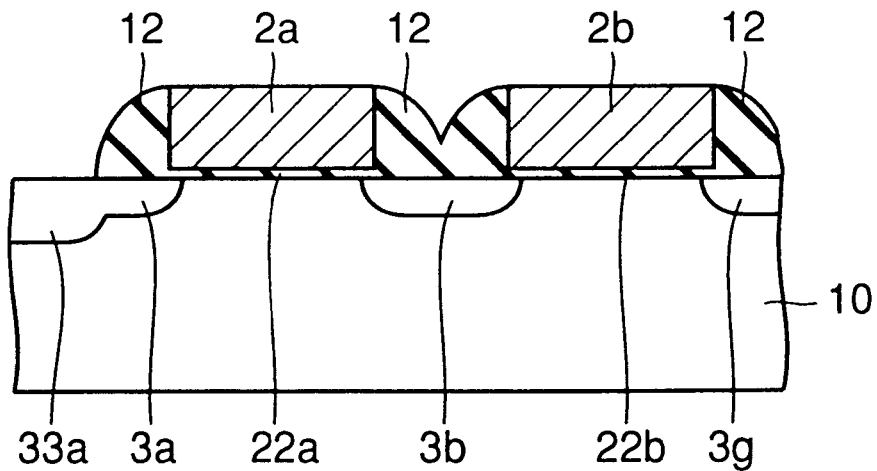
FIG. 6 is a cross sectional view of the SRAM of the first embodiment showing a step carried out subsequent to the step of FIG. 4.
Figure 7:
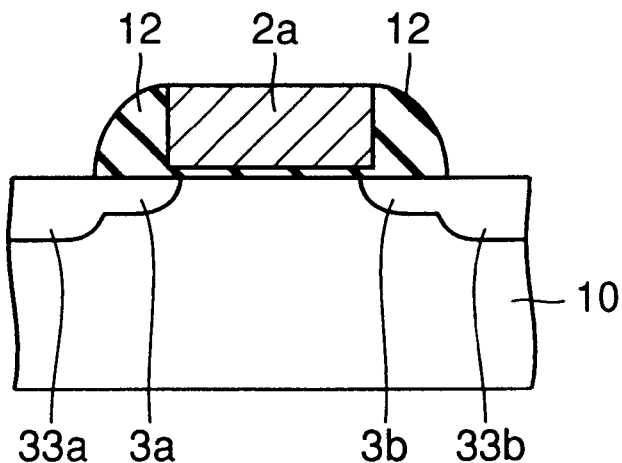
FIG. 7 is a sectional view of the SRAM of the first embodiment showing a step carried out subsequent to the step of FIG. 5.

Referring to FIGS. 6 and 7, n type impurities of a relatively high concentration are implanted into the surface of silicon substrate 10 with gate electrodes 2a and 2b and sidewall insulation film 12 as a mask. As a result, n⁺ source region 33b is formed at the region located between one end of gate electrode 2b and another gate electrode. N⁺ drain region 33a and the like are also formed at the same time.

Figure 8:
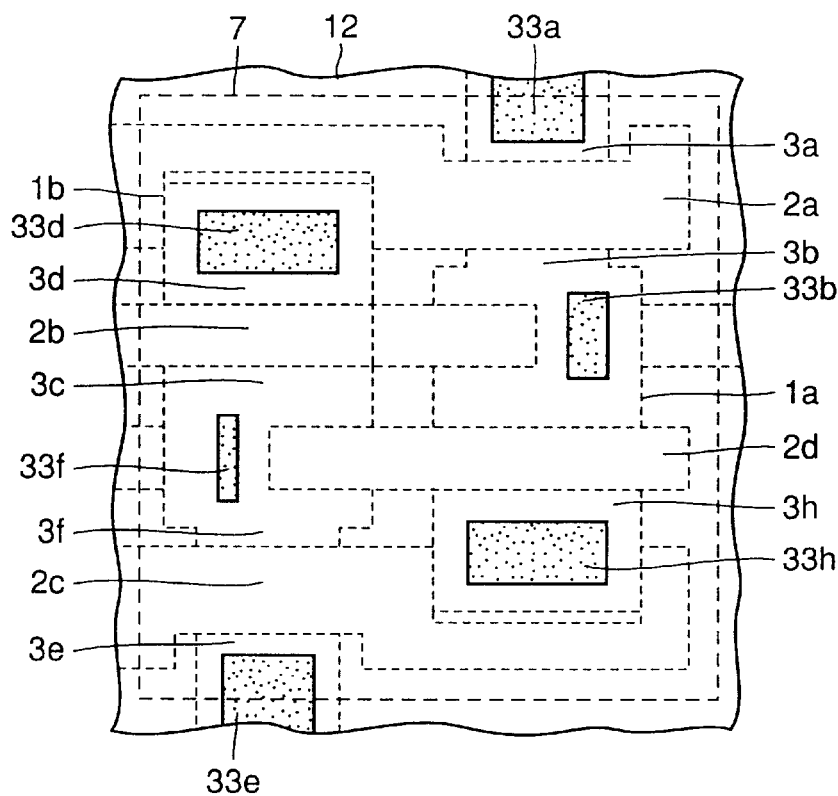
FIG. 8 is a plan view showing a plane structure corresponding to the steps of FIGS. 6 and 7.

A plane structure corresponding to this step is shown in FIG. 8. Referring to FIG. 8, n⁺ drain region 33a, n⁺ source region 33b, n⁺ source region 33h, n⁺ source region 33d, n⁺ source region 33f and n⁺ drain region 33e are respectively formed at each region exposed by forming sidewall insulation film 12.

Figure 9:
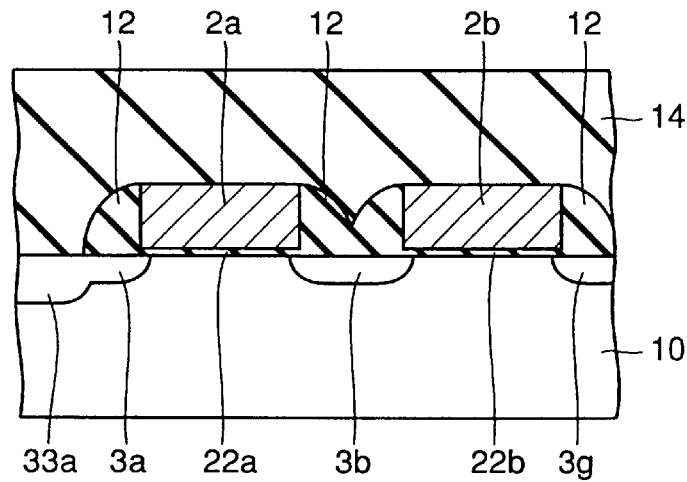
FIG. 9 is a sectional view of the SRAM of the first embodiment showing a step carried out subsequent to the step of FIG. 6.
Figure 10:
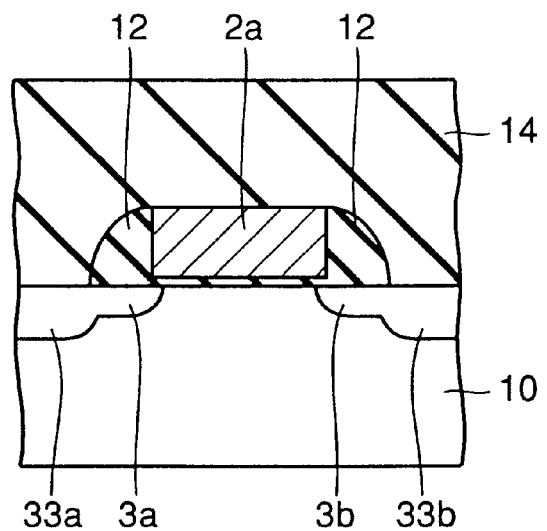
FIG. 10 is a sectional view of the SRAM of the first embodiment showing a step carried out subsequent to the step of FIG. 7.
Figure 11:
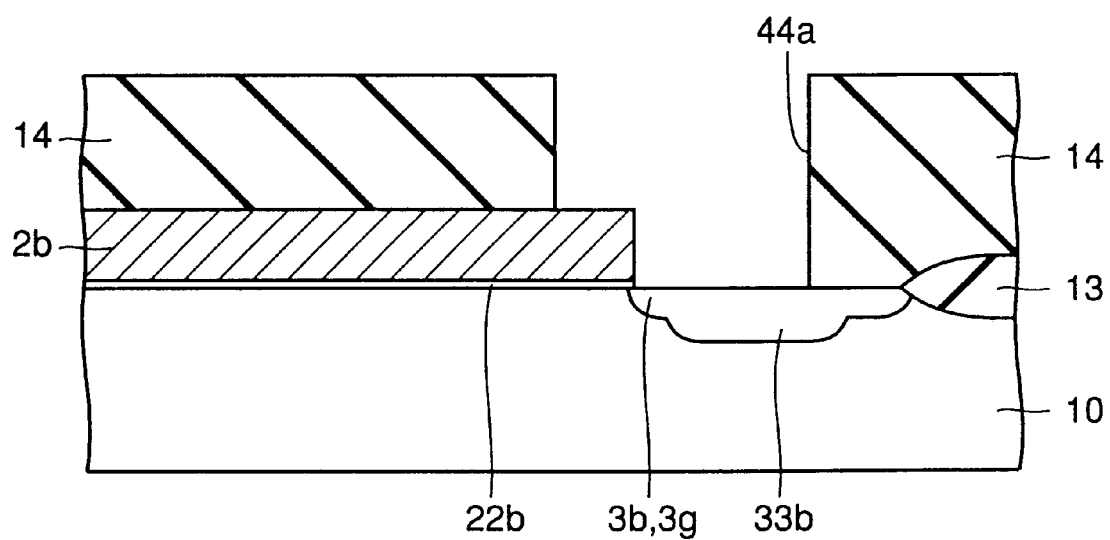
FIG. 11 is a sectional view of the SRAM of the first embodiment taken along line XI—XI of FIG. 1 to describe a step carried out subsequent to the steps shown in FIGS. 9 and 10.

Referring to FIGS. 9 and 10, a silicon oxide film 14 is formed by, for example, CVD, on silicon substrate 10 so as to cover gate electrodes 2a and 2b and sidewall insulation film 12. Referring to FIG. 11, a predetermined photoresist pattern (not shown) is formed on silicon oxide film 14. By etching silicon oxide film 14 anisotropically with that photoresist pattern as a mask, storage node contact hole 44a exposing gate electrode 2b and the surface of n⁻ and n⁺ source regions 3b and 33b is formed. It is to be noted that FIG. 11 shows a structure taken along line XI—XI of FIG. 1.

Figure 12:
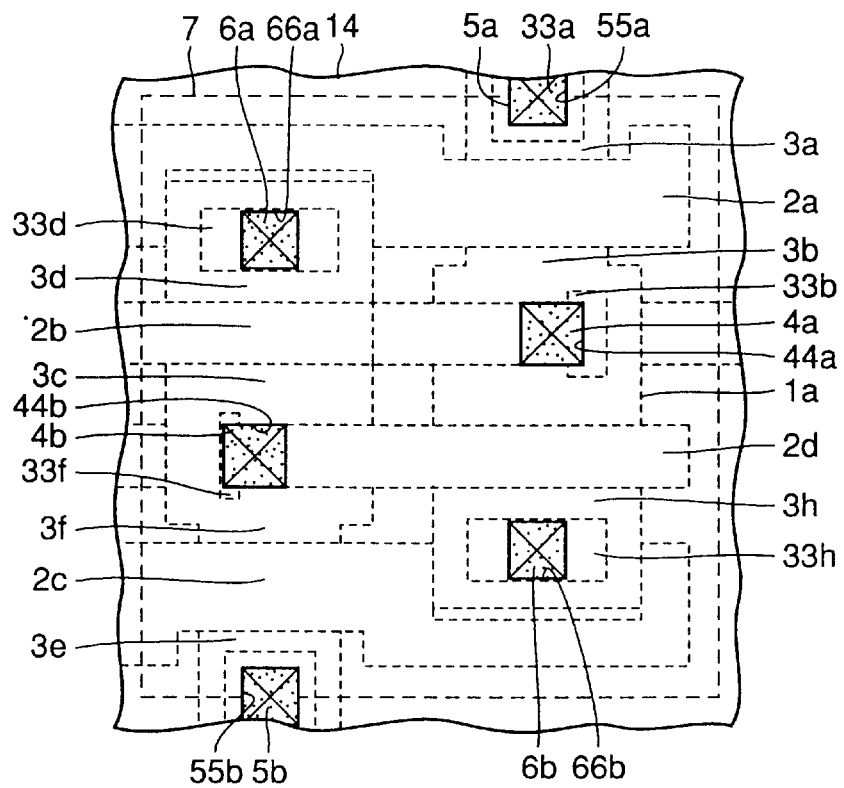
FIG. 12 is a plan view of the SRAM of the first embodiment showing a plane structure at the step of FIG. 11.

A plane structure of this step is shown in FIG. 12. Referring to FIG. 12, storage node contact holes 44a and 44b, bit line contact holes 55a and 55b, and ground contact holes 66a and 66b are formed at silicon oxide film 14.

Figure 13:
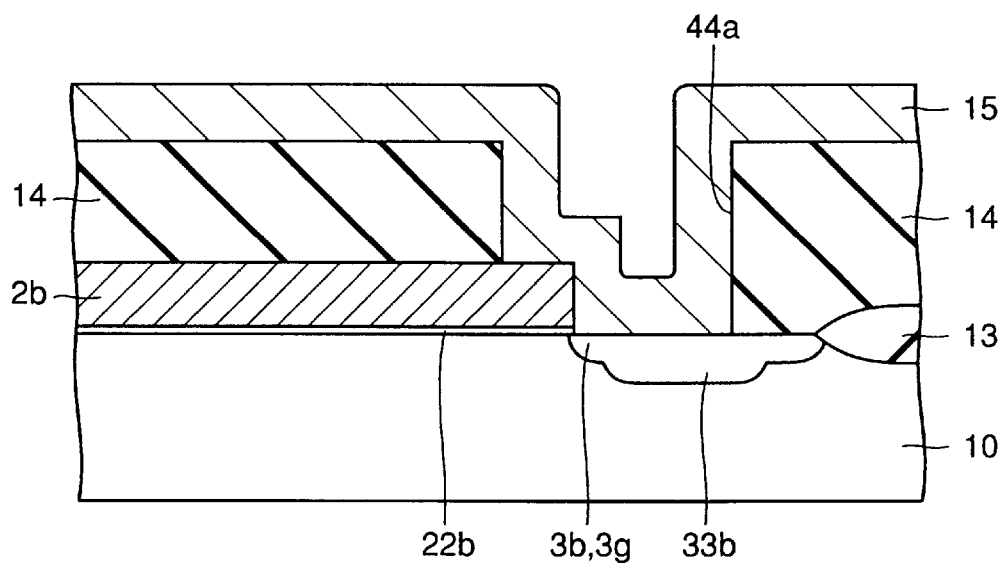
FIG. 13 is a sectional view of the SRAM of the first embodiment showing a step carried out subsequent to the step of FIG. 11.

Referring to FIG. 13, a polysilicon film 15 doped with phosphorus is formed by, for example, CVD, in storage node contact hole 44a. Alternatively, an undoped polysilicon film can be formed, and impurities such as arsenic implanted into that polysilicon film.

Here, a polysilicon film is formed also in storage node contact hole 44b, bit line contact holes 55a and 55b and ground contact holes 66a and 66b. By applying predetermined photolithography and process on that polysilicon film, the interconnection and the like are formed. Thus, the main part of the memory cell in the SRAM is completed.

According to the above fabrication method, the film thickness of TEOS film 11 that becomes sidewall insulation film 12 is at least half the distance between gate electrode 2a and gate electrode 2b. The distance L between one end of gate electrode 2b and another pattern is greater than the distance between gate electrodes 2a and 2b.

Therefore, the width of sidewall insulation film 12 is greater than half the distance between gate electrodes 2a and 2b. In the formation of sidewall insulation film 12 by etching TEOS film 11 anisotropically, the portion of n⁻ source region 3b located between one end of gate electrode 2b and another gate electrode can easily be exposed in self-alignment without exposing the surface of n⁻ source region 3b located between gate electrode 2a and gate electrode 2b. N type impurities of a relatively high concentration are implanted into the exposed n⁻ source region 3b, whereby n⁺ source region 33b of access transistor A1 is formed in self-alignment.

Similarly, n⁺ source region 33f is formed at a predetermined region in self-alignment in access transistor A2.

As described in the section of the background art, the present invention is advantageous that, when the n⁺ source region is formed with a photoresist pattern as a mask, a photomask to form such a photoresist pattern does not have to be newly added.

Since n⁺ source regions 33b and 33f are formed in self-alignment at exposed n⁻ source regions 3d and 3f for access transistors A1 and A2, n⁻ source regions 3b and 3f that are not exposed remain in self-alignment as the n⁻ source regions. Accordingly, variation in resistance of the source regions of access transistors A1 and A2 is reduced. As a result, variation in the characteristics of access transistors A1 and A2 is reduced.

Also, in the formation of storage node contact hole 44a, n⁺ source region 33b can be exposed reliably at the bottom thereof since the n⁺ source region is easily formed in self-alignment. This ensures the contact of polysilicon film 15 with n⁺ source region 33b and gate electrode 2b. As a result, the contact resistance at this portion is reduced.

Similarly, the contact resistance is reduced also in storage node contact hole 44b. Therefore, variation in the contact resistance of storage node contacts 4a and 4b can be reduced.

Thus, symmetry of the characteristics of access transistors A1 and A2 in one memory cell is improved and variation in the contact resistance is reduced. Therefore, the SRAM operates more stably.

Second Embodiment

Figure 14:
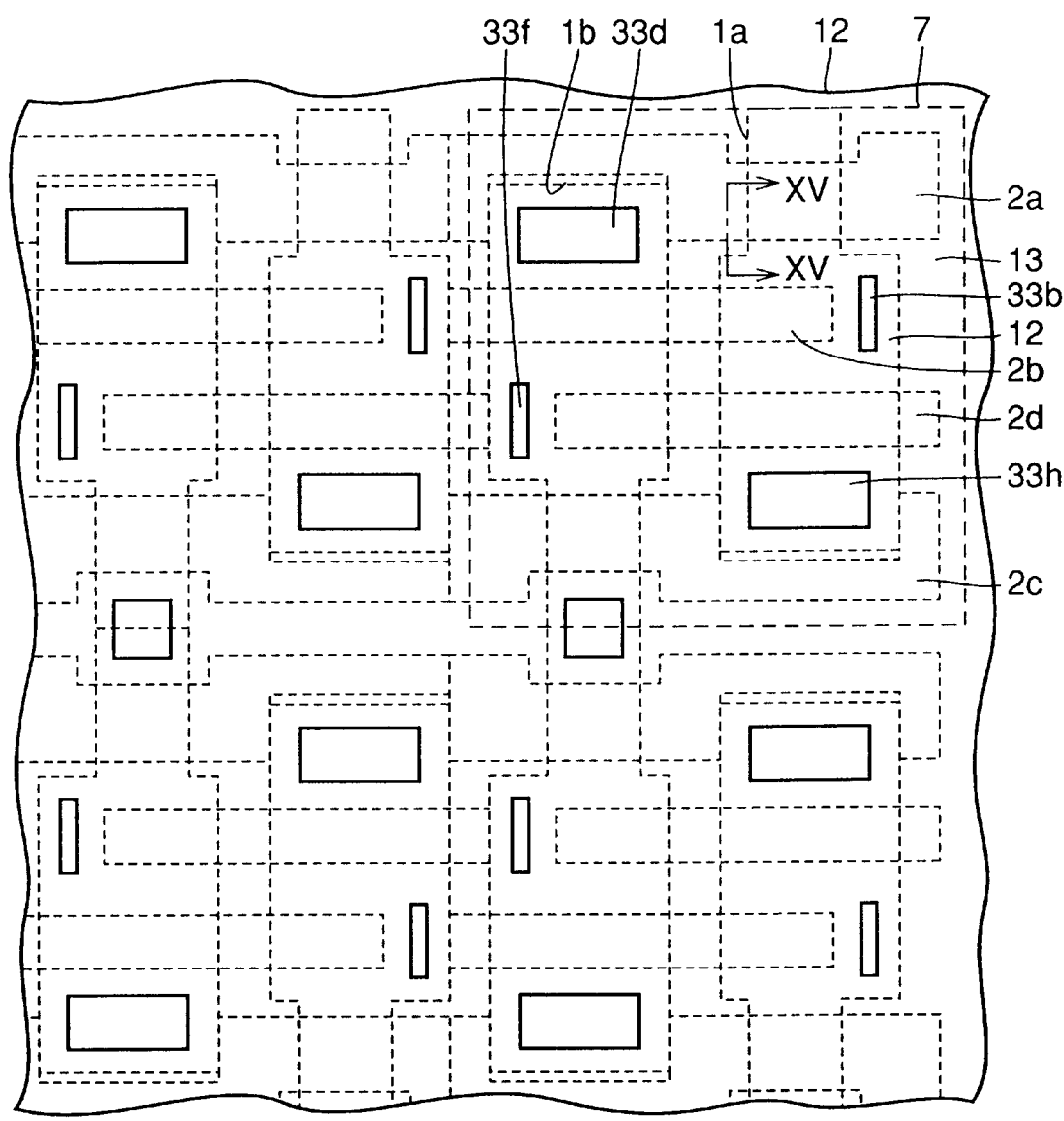
FIG. 14 is a plan view of an SRAM according to a second embodiment of the present invention.

An SRAM according to a second embodiment will be described with reference to the drawings. A plane structure of a memory cell of the SRAM of the second embodiment is shown in FIG. 14. Referring to FIG. 14, sidewall insulation film 12 respectively formed at both sides of each of gate electrodes 2a, 2b, 2d, 2c and the like is formed so as to cover the boundary between field oxide film 13 and element formation regions 1a and 1b and the neighborhood thereof.

In other words, the pattern of each gate electrode is arranged so that, in the formation of sidewall insulation film 12, the region to form n⁺ source and drain regions 33b, 33h, 33d, 33f and the like are exposed whereas the boundary and the neighboring portion thereof are not exposed, as described in the first embodiment.

More specifically, sidewall insulation film 12 has a width at least half the distance between the gate electrodes. The boundary and neighboring portion are covered with sidewall insulation film 12 except for the portion covered with the gate electrode.

Figure 15:
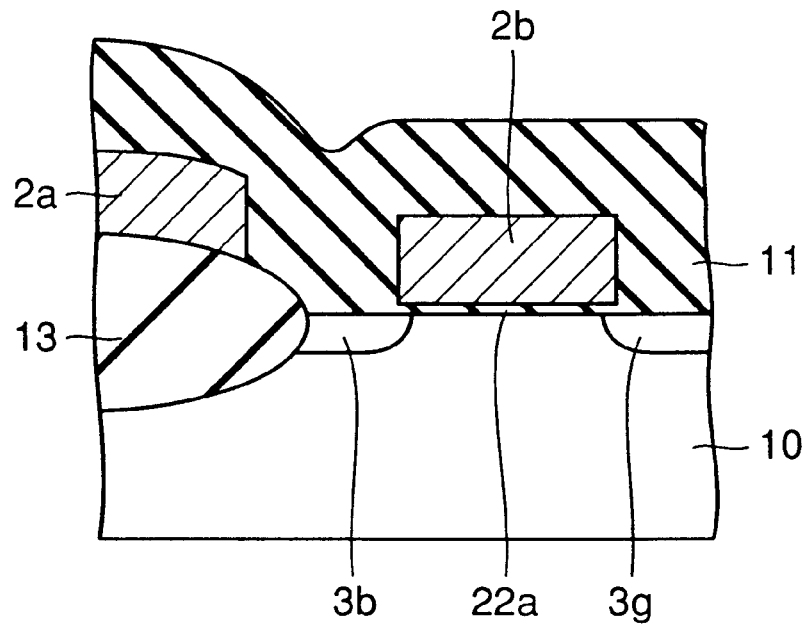
FIG. 15 is a sectional view of the SRAM of the second embodiment taken along line XV—XV of FIG. 14 to describe a step of a fabrication method thereof.
Figure 16:
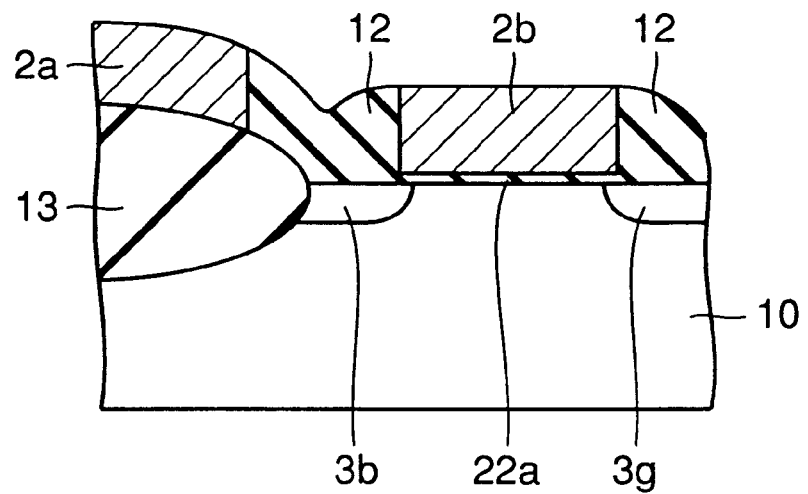
FIG. 16 is a sectional view of the SRAM of the second embodiment showing a step carried out subsequent to the step of FIG. 15.
Figure 17:
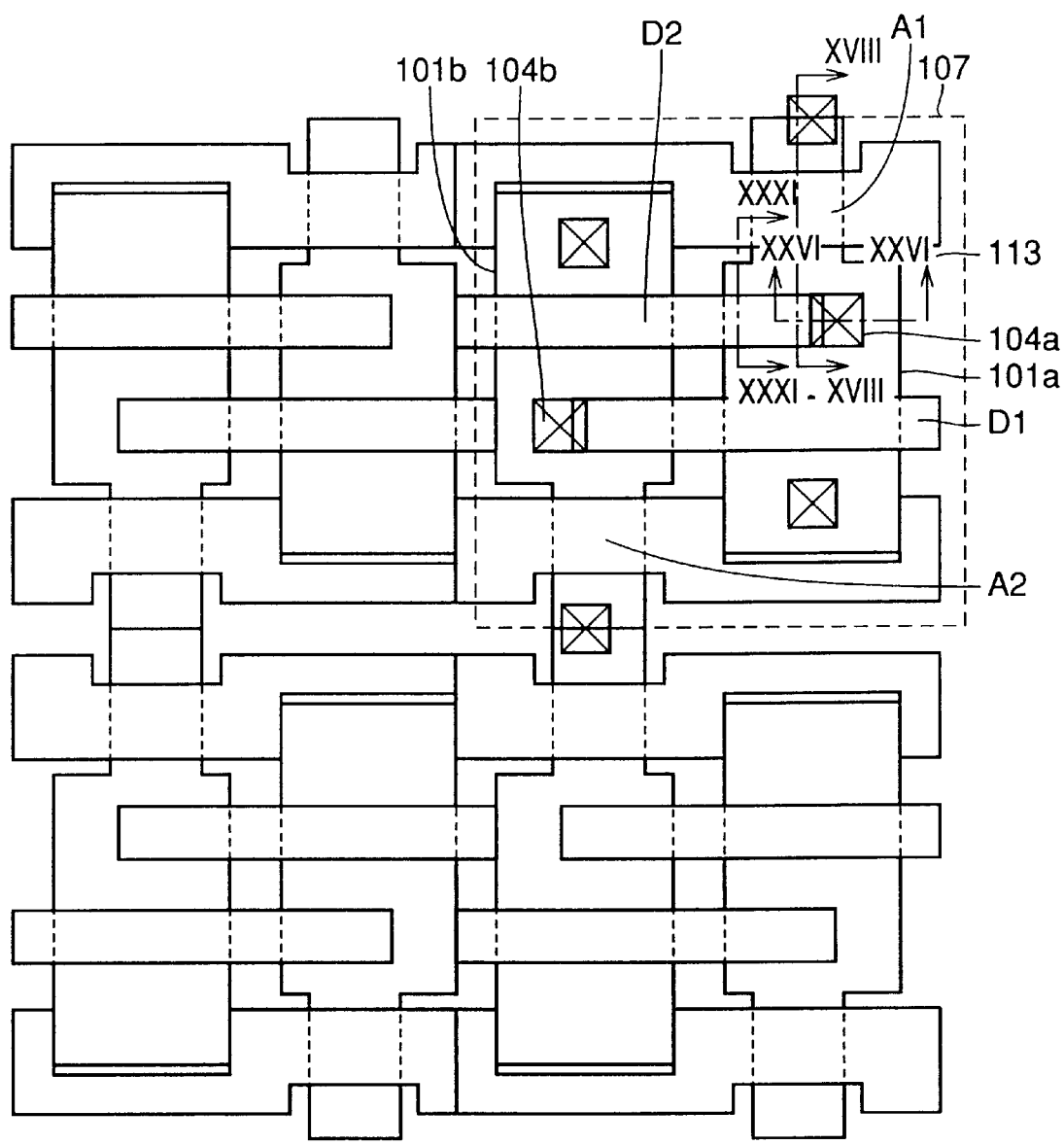
FIG. 17 is a plan view of a conventional SRAM.
Figure 18:
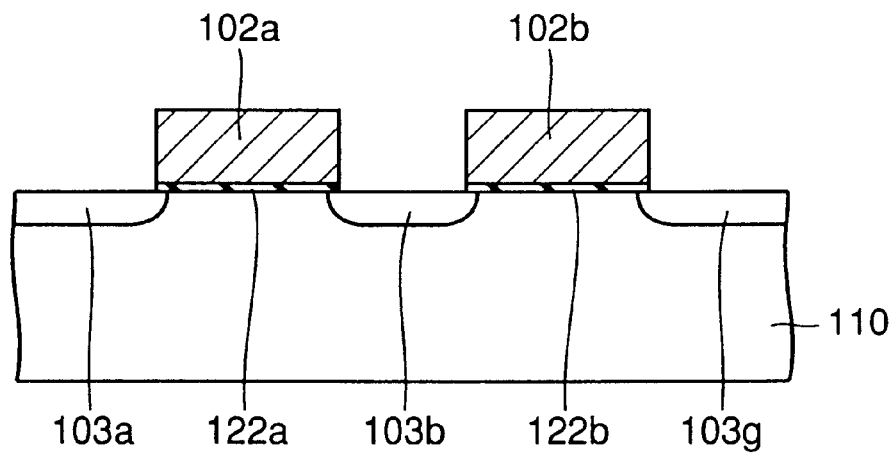
FIG. 18 is a sectional view of the conventional SRAM of FIG. 17 taken along line XVIII—XVIII of FIG. 17 to describe a step of a fabrication method thereof.
Figure 19:
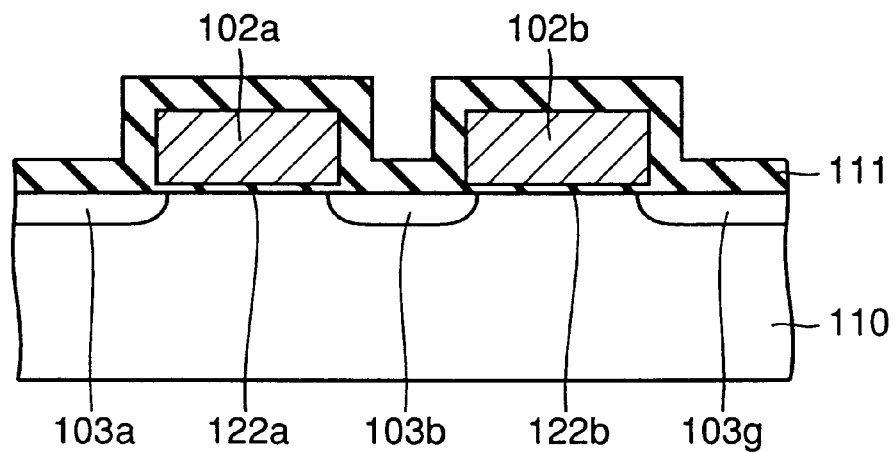
FIG. 19 is a sectional view of the conventional SRAM showing a step carried out subsequent to the step of FIG. 18.
Figure 20:
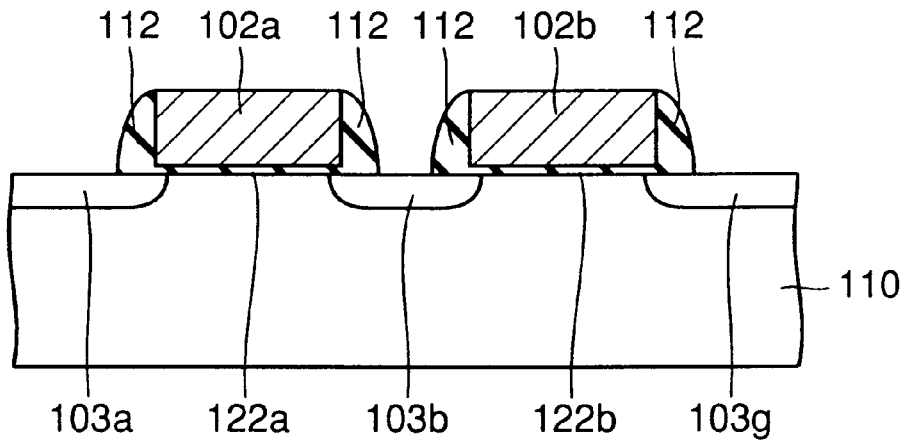
FIG. 20 is a sectional view of the conventional SRAM showing a step carried out subsequent to the step of FIG. 19.
Figure 21:
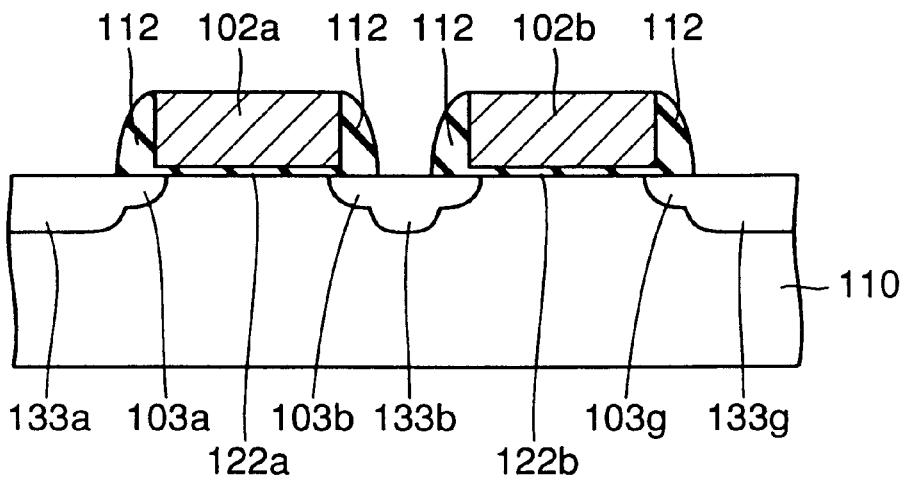
FIG. 21 is a sectional view of the SRAM showing a step carried out subsequent to the step of FIG. 20.
Figure 22:
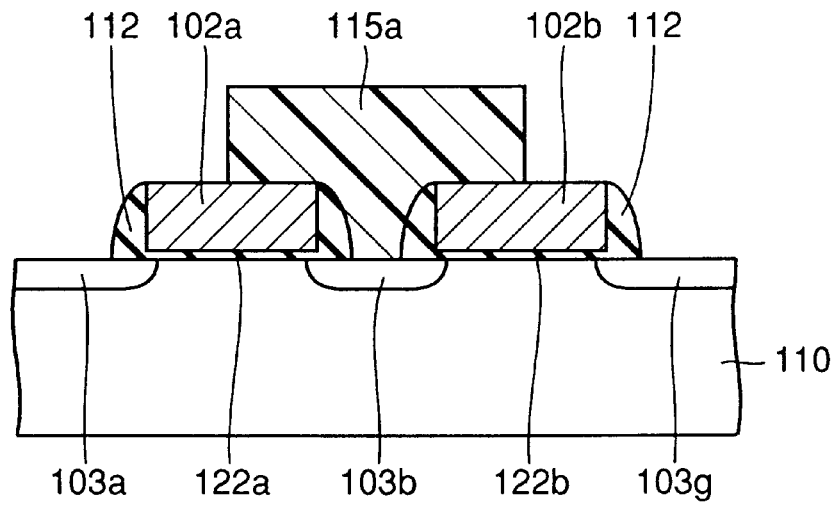
FIG. 22 is a sectional view of a conventional semiconductor device taken along line XXII—XXII of FIG. 23 to describe a step of another fabrication method thereof.
Figure 23:
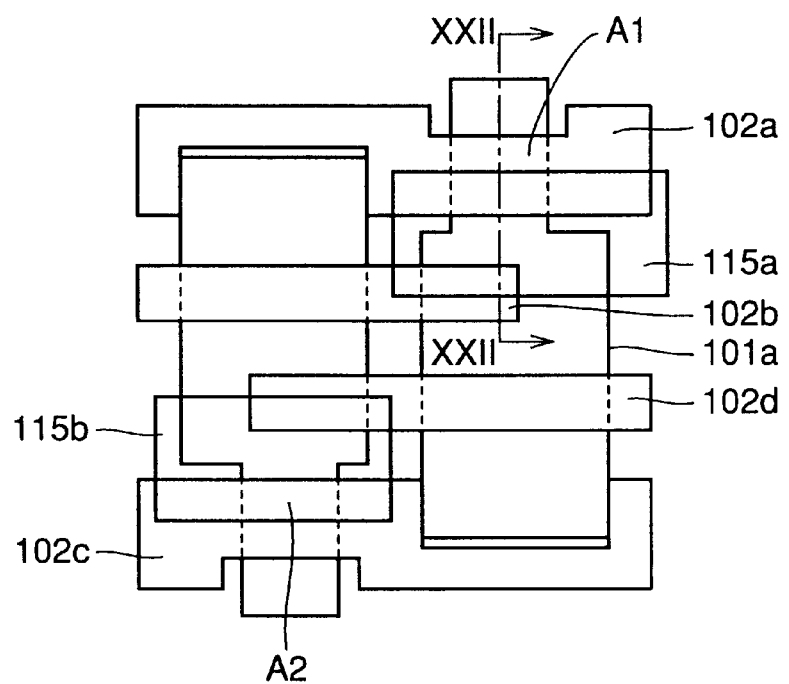
FIG. 23 is a plan view showing a plane structure of the SRAM at the step of FIG. 22.
Figure 24:
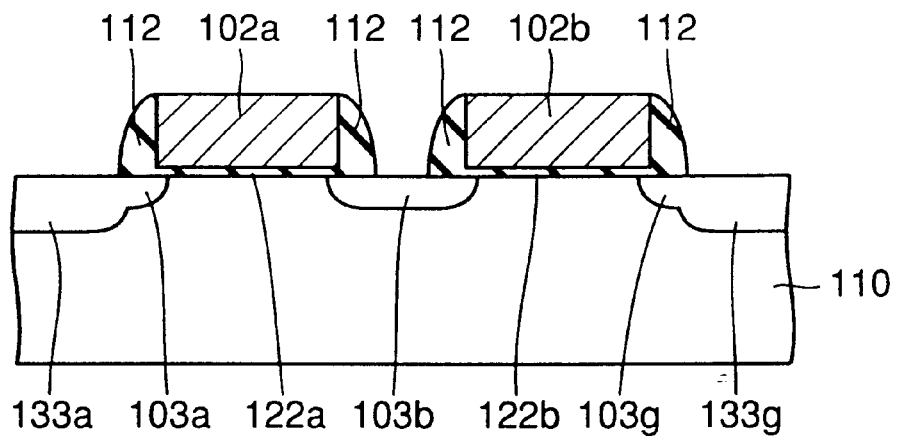
FIG. 24 is a sectional view of the conventional SRAM showing a step carried out subsequent to the step of FIG. 22.
Figure 25:
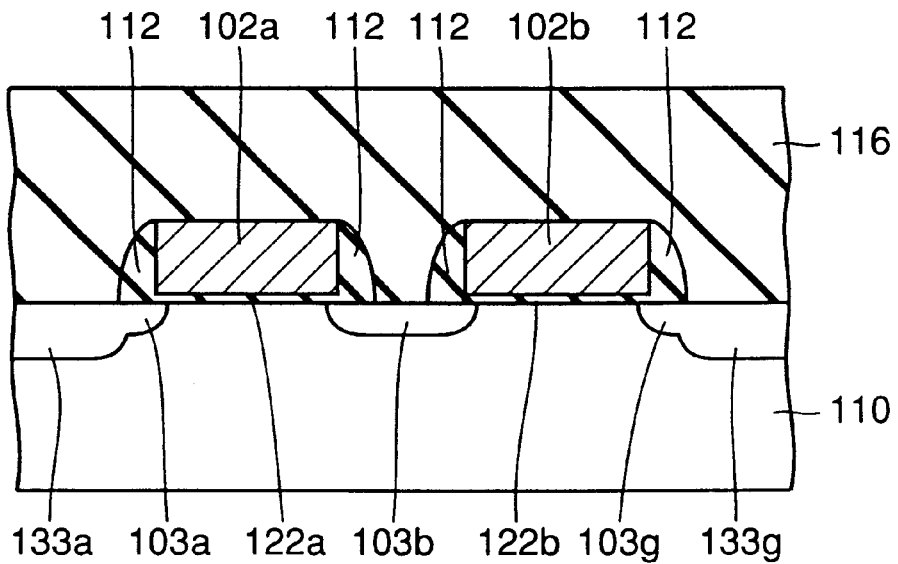
FIG. 25 is a sectional view of the conventional semiconductor device showing a step carried out subsequent to the step of FIG. 24.
Figure 26:
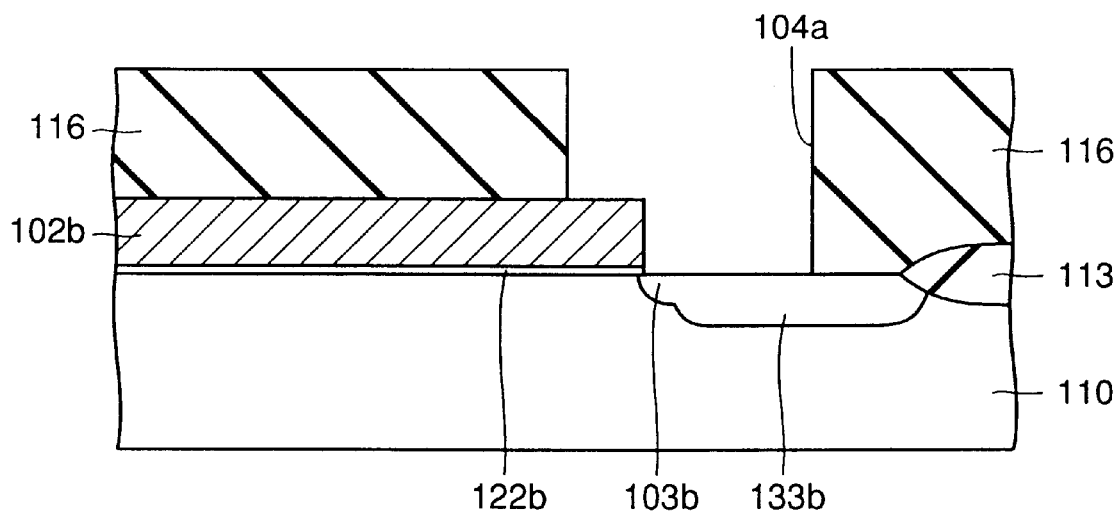
FIG. 26 is a sectional view of the conventional semiconductor device taken along line XXVI—XXVI of FIG. 17 to describe a step carried out subsequent to the step of FIG. 25.
Figure 27:
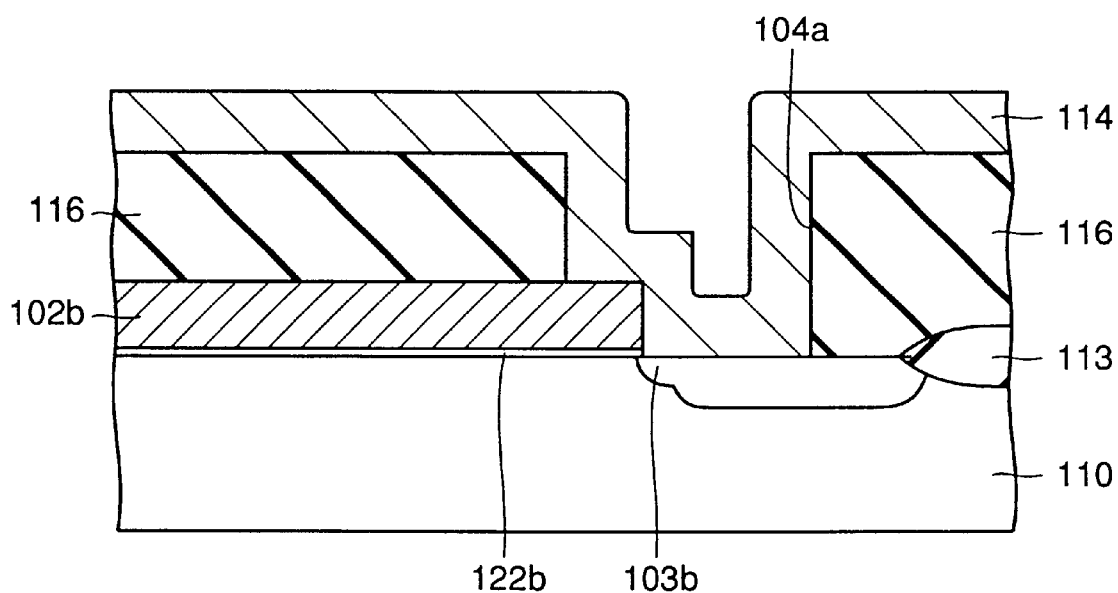
FIG. 27 is a sectional view showing a step carried out subsequent to the step of FIG. 26.
Figure 28:
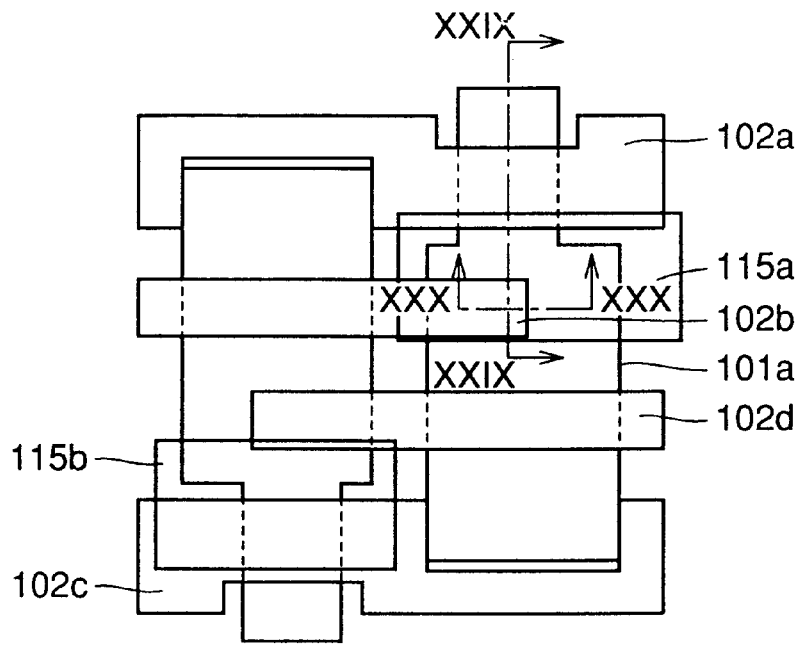
FIG. 28 is a plan view to describe a problem in a conventional SRAM fabrication method.
Figure 29:
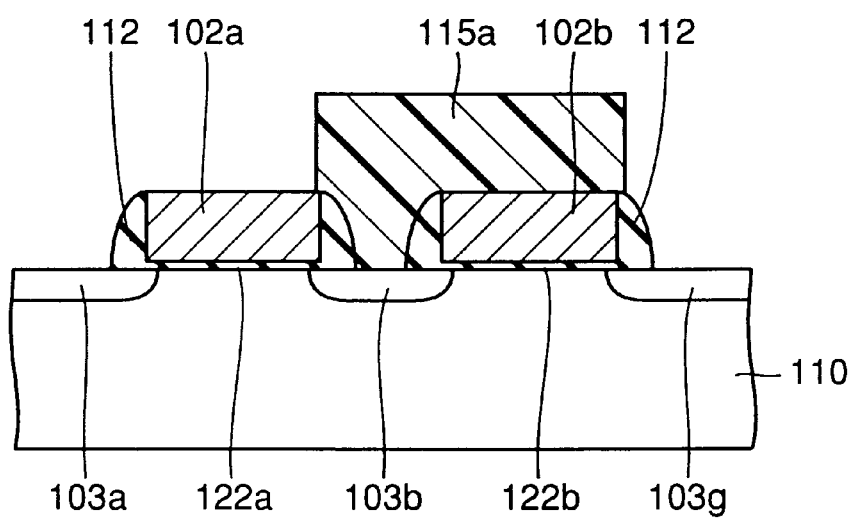
FIG. 29 is a sectional view of the conventional SRAM of FIG. 28 taken along line XXIX—XXIX.
Figure 32:
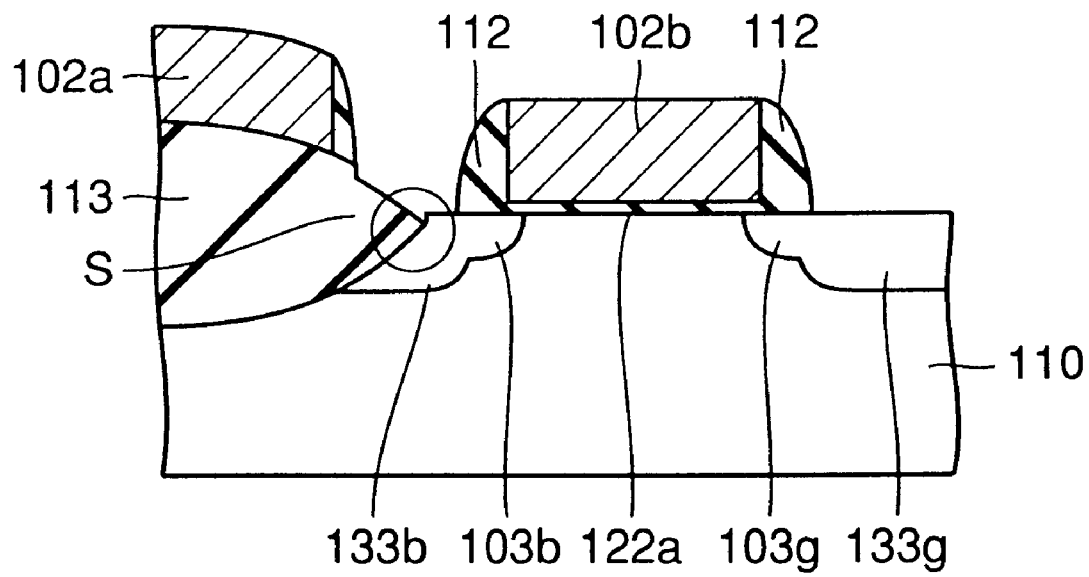
FIG. 32 is a sectional view of the conventional SRAM of FIG. 31 to describe a step carried out subsequent to the step of FIG. 31.

An example of a fabrication method of the above memory cell will be described according to the sectional line XV—XV of FIG. 14. Referring to FIG. 15, TEOS film 11 is formed so as to cover gate electrodes 2a and 2b formed on silicon substrate 10. Here, the film thickness of TEOS film 11 is desirably at least half the distance between gate electrode 2a and gate electrode 2b.

Therefore, in the formation of sidewall insulation film 12 by etching TEOS film 11 anisotropically, the boundary portion between field oxide film 13 and the element formation region and the neighborhood thereof in the region sandwiched by gate electrodes 2a and 2b will not be exposed.

As a result, the portion in the proximity of the boundary between the field oxide film and the element formation region will not be etched simultaneously. Therefore, leakage current from that portion can be suppressed.

Although an n type region has been indicated as the impurity region of each transistor in the above embodiments, a p type impurity region may be used instead.

Also, the structure described in the second embodiment can be applied, not only to the memory cell of an SRAM, but also to other semiconductor devices. For example, the structure is applicable to the memory cell of, for example, a dynamic random access memory (DRAM). Leakage current can be suppressed and a DRAM superior in storage retention characteristics can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

an element formation region divided by an element isolation insulation film at a main surface of a semiconductor substrate;

a semiconductor element including a first electrode formed to traverse said element formation region, and one pair of first impurity regions of a predetermined conductivity type formed at said element formation region so as to sandwich said first electrode from both sides, and having a first impurity concentration;

a second electrode formed at said element formation region, extending parallel to and apart from said first electrode by a predetermined distance, and having one end located within said element formation region;

a first sidewall insulation film and a second sidewall insulation film formed on respective sides of said first and second electrodes, at least covering said first impurity region sandwiched by said first and second electrodes, and exposing said first impurity region in close proximity to said one end of said second electrode; and a second impurity region formed from one end of the second electrode towards a longitudinal direction, and surrounded by one of said pair of first impurity regions at the main surface of the semiconductor substrate.

2. The semiconductor device according to claim 1, wherein said first sidewall insulation film and said second sidewall insulation film have a width at least half a distance between said first electrode and said second electrode.

3. The semiconductor device according to claim 1, wherein a static memory cell is formed at the main surface of said semiconductor substrate, said static memory cell including a pair of driver transistors having gates and drains cross-coupled, and a pair of access transistors having their sources connected to the drains of respective driver transistors, said semiconductor element including one access transistor out of said pair of access transistors.

4. The semiconductor device according to claim 1, comprising:

an insulation film formed on said semiconductor substrate so as to cover said first electrode and said second electrode;

a contact hole formed at said insulation film, exposing said one end of said second electrode and a surface of said second impurity region; and a conductor formed at said contact hole.

5. The semiconductor device according to claim 1, wherein said one end of said second electrode is located apart by a distance greater than said predetermined distance from another pattern positioned at least in a longitudinal direction of said second electrode from said one end.

6. The semiconductor device according to claim 5, wherein said first sidewall insulation film and said second sidewall insulation film have a width at least half a distance between said first electrode and said second electrode.

* * * * *